US012648440B2

(12) United States Patent
Hong et al.

(10) Patent No.: US 12,648,440 B2
(45) Date of Patent: Jun. 2, 2026

(54) METHOD FOR MANUFACTURING DOUBLE-SIDED COOLING TYPE POWER MODULE AND DOUBLE-SIDED COOLING TYPE POWER MODULE

(71) Applicants: HYUNDAI MOTOR COMPANY, Seoul (KR); KIA CORPORATION, Seoul (KR)

(72) Inventors: Kyoung-Kook Hong, Hwaseong-si (KR); Su-Bin Kang, Seongnam-si (KR); Young-Seok Kim, Seongnam-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 130 days.

(21) Appl. No.: 17/703,057

(22) Filed: Mar. 24, 2022

(65) Prior Publication Data

US 2023/0187403 A1     Jun. 15, 2023

(30) Foreign Application Priority Data

Dec. 10, 2021     (KR) ........................ 10-2021-0176417

(51) Int. Cl.
H01L 23/00 (2006.01)
H01L 23/373 (2006.01)
(Continued)

(52) U.S. Cl.
CPC .... H10W 40/255 (2026.01); H10W 72/01336 (2026.01); H10W 72/01351 (2026.01);
(Continued)

(58) Field of Classification Search
CPC ........... H01L 23/3735; H01L 23/49811; H01L 23/49833; H01L 23/49844; H01L 24/27;
(Continued)

(56) References Cited

U.S. PATENT DOCUMENTS

| | | | |
|---|---|---|---|
| 7,738,263 B2 | 6/2010 | Kitamura et al. | |
| 8,240,037 B2 | 8/2012 | Kitamura et al. | |

(Continued)

FOREIGN PATENT DOCUMENTS

| | | | |
|---|---|---|---|
| JP | 2005-228919 A | 8/2005 | |
| JP | 2009-010170 A | 1/2009 | |

(Continued)

*Primary Examiner* — Julio J Maldonado
*Assistant Examiner* — Stanetta D Isaac
(74) *Attorney, Agent, or Firm* — MCDONNELL BOEHNEN HULBERT & BERGHOFF LLP

(57) ABSTRACT

The present disclosure provides a method for manufacturing a double-sided cooling type power module including separately patterning a bonding material on a base film into two regions, positioning a semiconductor chip on the patterned bonding material, transferring the patterned bonding material to one surface of the semiconductor chip by pressurizing the semiconductor chip, positioning the bonding material of the semiconductor chip on an upper electrode layer formed on an upper substrate to be in contact with the upper electrode layer, and sintering an upper bonding layer by pressurizing and heating the semiconductor chip. According to the present disclosure, it is possible to separately dispose the bonding material on each of gate and source electrode parts on an upper portion of the chip even without protrusion to directly bond the chip and the substrate.

5 Claims, 21 Drawing Sheets

(51) Int. Cl.

| | |
|---|---|
| *H10W 40/25* | (2026.01) |
| *H10W 72/00* | (2026.01) |
| *H10W 72/30* | (2026.01) |
| *H10W 72/90* | (2026.01) |
| *H10W 90/00* | (2026.01) |

(52) U.S. Cl.

CPC .... *H10W 72/073* (2026.01); *H10W 72/07331* (2026.01); *H10W 72/07332* (2026.01); *H10W 72/07352* (2026.01); *H10W 72/07354* (2026.01); *H10W 72/327* (2026.01); *H10W 72/347* (2026.01); *H10W 72/352* (2026.01); *H10W 72/952* (2026.01); *H10W 90/734* (2026.01)

(58) Field of Classification Search

CPC ......... H01L 24/32; H01L 24/33; H01L 24/83; H01L 2224/2711; H01L 2224/27438; H01L 2224/29139; H01L 2224/32225; H01L 2224/3303; H01L 2224/33181; H01L 2224/83191; H01L 2224/83192; H01L 2224/83201; H01L 2224/83447; H01L 2224/8384; H10W 40/233; H10W 40/235; H10W 90/726; H10W 90/727; H10W 90/731; H10W 90/734; H10W 90/736; H10W 90/737

See application file for complete search history.

(56) References Cited

U.S. PATENT DOCUMENTS

| | | | | |
|---|---|---|---|---|
| 9,346,665 | B2 | 5/2016 | Kinugawa et al. | |
| 11,075,137 | B2 | 7/2021 | Lin et al. | |
| 2013/0015468 | A1* | 1/2013 | Kikuchi | H01L 23/36 |
| | | | | 257/77 |
| 2014/0246737 | A1 | 9/2014 | Kinugawa et al. | |
| 2019/0341332 | A1* | 11/2019 | Lin | H01L 25/18 |
| 2020/0185310 | A1 | 6/2020 | Cho | |
| 2021/0057372 | A1 | 2/2021 | Oh et al. | |

FOREIGN PATENT DOCUMENTS

| | | | |
|---|---|---|---|
| JP | 2014-170997 | A | 9/2014 |
| JP | 2020-205410 | A | 12/2020 |
| KR | 10-2048478 | B1 | 11/2019 |
| KR | 2020-0068285 | A | 6/2020 |
| KR | 2021-0073328 | A | 6/2021 |
| KR | 2021-0076862 | A | 6/2021 |

* cited by examiner

FIG. 22

METHOD FOR MANUFACTURING DOUBLE-SIDED COOLING TYPE POWER MODULE AND DOUBLE-SIDED COOLING TYPE POWER MODULE

CROSS REFERENCE TO RELATED APPLICATIONS

This application claims priority to Korean Patent Application No. 10-2021-0176417, filed on Dec. 10, 2021, which is incorporated herein by reference in its entirety.

BACKGROUND

Field of the Disclosure

The present disclosure relates to a method for manufacturing a double-sided cooling type power module and a power module.

Description of Related Art

Interest in and development of a hybrid electric vehicle and an electric vehicle are increasing. These eco-friendly vehicles are provided with a power conversion device such as an inverter to convert the power supplied from a rechargeable battery or a fuel cell using hydrogen fuel into power for driving a motor.

This power conversion device is provided with a power module having a power semiconductor chip for power conversion mounted thereon.

Meanwhile, a single-phase (2 in 1) mold type module is applied to reduce the size of an inverter system, and a double-sided cooling type power module having the form that can be cooled in both upper and lower surfaces of a chip has been developed to maximize the cooling effect.

Recently, among power semiconductors, a power module to which a SiC element is applied is being actively developed, several SiC MOSFET chip elements are disposed in parallel to implement a high output, and the power module is being developed by applying the design of a structure of the double-sided cooling type module to enhance the cooling effect.

As shown in FIG. 1, a structure of a conventional double-sided cooling type power module has employed a structure called a spacer 4 between a source part on an upper portion of a chip and an upper substrate to secure a space for a bonding wire for connecting gate and source signals of an upper surface of a chip 1 from the chip 1 to a substrate 2. The structure of the spacer 4 is made of a Cu-based metal to deliver current and heat, and requires the thickness of at least 1.2 mm to secure the space for the bonding wire. Therefore, the expansion and contraction of the spacer 4 occurs repeatedly due to the heat generated during the operation of the power module, and the thermal stress caused thereby is delivered to the upper surface of the chip 1 disposed just below the spacer 4, thereby causing defects or destruction of the element.

To prevent damage to an upper portion of the chip and destruction of the chip due to the thick spacer as described above, research on removing the spacer by removing the wire bonding connection on the upper portion of the chip has been recently conducted.

However, a conventional function of the bonding connection of the signal part should be implemented through the bonding, and to separately bond a source electrode part and a gate signal part on the upper portion of the chip, a bonding material separated into each electrode part should be moved and maintained even after bonded.

A structure for this is shown in FIG. 2, and is a structure to which a protrusion structure (protrusion 5 in FIG. 2) having the thickness of at least 0.5 mm is applied, and manufactured through a process of FIGS. 3 to 8.

First, a semiconductor chip 1 is moved to an Ag film to which an Ag paste layer is attached by a release agent coating layer (OCA) on a base film using a chuck to be in contact with an Ag bonding layer 6 as shown in FIG. 4, and the semiconductor chip 1 is transferred as shown in FIG. 5.

In addition, as shown in FIG. 6, the substrate 2 on which a Cu-based protrusion 5 is formed is moved by using the chuck to be in contact with the Ag bonding layer 7 as shown in FIG. 7, and the Ag bonding layer 7 is transferred to the protrusion 5 as shown in FIG. 8. Then, the bonding is implemented as shown in FIG. 2 through pressure sintering.

As described above, in the structure to which the protrusion is applied, the thick metal spacer can be removed by using a method for removing the wire bonding and directly bonding the protrusion to the chip, but there is a need for a transfer process method for moving the Ag bonding material to the bonding part to directly bond the protrusion to the chip. Therefore, a process of manufacturing a module is performed in a method for disposing the protrusion structure having 0.5 mm or more other than a planar substrate on the substrate and then transferring the bonding material to the protrusion, and bonding the protrusion to the chip.

According to the conventional method, the bonding material of the Ag film can be directly transferred to the protrusion previously separated to be suitable for the gate electrode part and the source electrode part and moved, and the Ag bonding material thus separated into and transferred to the individual electrode part is in contact with the upper portion of the chip as it is and then is subjected to the pressure sintering, thereby implementing the bonding, respectively. In other words, the purpose of disposing the protrusion connected to the upper portion of the chip is to move each Ag bonding material to the source and gate electrode parts separated on the upper portion of the chip.

As a method for manufacturing an insulating circuit substrate with the protrusion formed, there are largely a thick printing copper (TPC) method for continuously applying a Cu paste to implement the shape of the protrusion and a method for bonding the shape of the metal-based protrusion to the insulating circuit substrate. Among them, since the method for continuously applying the Cu paste such as TPC has a limit to implementing the thickness of about 500 μm required for transferring the Ag film material for bonding, a method for bonding the shape of the metal protrusion to the substrate is mainly used for the protrusion for the transferring and sintering bonding of the Ag film.

The method for bonding the shape of the protrusion to the substrate is generally performed through brazing bonding, and it is necessary to control a void distribution generated in the corresponding brazing bonding part to a minimum and to precisely control the thickness of the substrate including the protrusion. If the void distribution is excessive, the electrical and heat delivery characteristics can be reduced, and if the thickness is not uniform, the non-uniformity of the bonding can occur during the pressure sintering after a number of parallel chips are disposed.

The contents described in Description of Related Art are to help the understanding of the background of the present disclosure, and may include what is not previously known to those skilled in the art to which the present disclosure pertains.

SUMMARY

The present disclosure has been made in efforts to solve the above problem associated with the related art, and an object of the present disclosure is to provide a method for manufacturing a double-sided cooling type power module and the double-sided cooling type power module, which can directly bond a chip and a substrate by separately disposing a bonding material on each of gate and source electrode parts on an upper portion of the chip even without protrusion.

A method for manufacturing a double-sided cooling type power module according to one aspect of the present disclosure includes separately patterning a bonding material on a base film into two regions, positioning a semiconductor chip on the patterned bonding material, transferring the patterned bonding material to a first surface of the semiconductor chip by pressurizing the semiconductor chip, positioning the bonding material of the semiconductor chip on an upper electrode layer formed on an upper substrate to be in contact with the upper electrode layer, and sintering an upper bonding layer by pressurizing and heating the semiconductor chip.

Here, the upper electrode layer has a first region and a second region separately formed spaced apart from each other.

In addition, the positioning of the bonding material of the semiconductor chip to be in contact with the upper electrode layer disposes two regions of the bonding material to be in contact with the first region and the second region, respectively.

In addition, the separated two regions of the bonding material are separately formed to correspond to a gate electrode part and a source electrode part of the semiconductor chip, respectively.

In addition, the patterning removes a region surrounding the two regions of the bonding material.

In addition, the method further includes positioning a second surface of the semiconductor chip on a lower electrode layer formed on a lower substrate after the sintering the upper bonding layer and sintering the lower bonding layer interposed between the semiconductor chip and the lower electrode layer by pressurizing and heating the semiconductor chip.

Next, a method for manufacturing a double-sided cooling type power module according to another aspect of the present disclosure includes positioning a bonding material on a base film on an upper electrode layer formed on an upper substrate to be in contact with the upper electrode layer, separately patterning the bonding material into two regions to transfer it to the upper electrode layer, positioning a first surface of the semiconductor chip on the patterned bonding material to be in contact with the patterned bonding material, and sintering an upper bonding layer by pressurizing and heating the semiconductor chip.

In addition, the upper electrode layer has a first region and a second region separately formed spaced apart from each other.

In addition, the separately patterning of the bonding material into two regions to transfer it to the upper electrode layer patterns two regions of the bonding material to correspond to the first region and the second region.

In particular, the separated two regions of the bonding material are separately formed to correspond to a gate electrode part and a source electrode part of the semiconductor chip, respectively.

Furthermore, the separately patterning of the bonding material into two regions to transfer it to the upper electrode layer removes a region surrounding the two regions of the bonding material.

In addition, the method further includes positioning a second other surface of the semiconductor chip on a lower electrode layer formed on a lower substrate after the sintering of the upper bonding layer and sintering the lower bonding layer interposed between the semiconductor chip and the lower electrode layer by pressurizing and heating the semiconductor chip.

Next, a double-sided cooling type power module according to one aspect of the present disclosure includes a semiconductor chip, an upper substrate bonded to an upper surface of the semiconductor chip, and a lower substrate bonded to a lower surface of the semiconductor chip, in which the semiconductor chip is directly bonded to an upper electrode formed on the upper substrate.

In addition, a bonding material interposed between an upper surface of the semiconductor chip and the upper electrode is separately patterned into two regions.

Alternatively, the upper electrode layer has a first region and a second region separately formed to be spaced apart from each other, and the two regions of the bonding material are in contact with the first region and the second region, respectively.

In addition, the separated two regions of the bonding material are separately formed to correspond to a gate electrode part and a source electrode part of the semiconductor chip, respectively.

Meanwhile, a groove is formed in a surface that is not bonded to the upper bonding layer of the upper electrode layer and adjacent to the upper bonding layer.

In addition, the depth of the groove is 50 μm or more, and a linear distance in a surface direction from the edge of the groove to the edge of the semiconductor chip is 100 μm or more.

The effects that can be obtained by implementing the ultra-thin power module proposed by the present disclosure are as follows.

It is possible to remove the unnecessary structure such as the protrusion or the spacer between the chip and the substrate to maximally dissipate the heat generated when the elements of the chip are operated, thereby improving the heat conductivity and lowering the operation temperature of the module.

When the heat distribution for each module structure based on the unit structure cell in which only one chip is disposed is analyzed, it can be confirmed that the maximum temperature of the surface of the chip is 102.7° C. for the thin structure proposed by the present disclosure, and the corresponding value is reduced by 3.5% from 106.4° C., which is a value of the Cu-based alloy protrusion structure and by 8% from 110.1° C., which is a value of the structure to which the Cu-based spacer is applied. The reduction in this maximum temperature can be determined as the result of lowering the thermal stress.

In addition, for the thin module, it is possible to implement a total thickness of the module as 2.1 mm or less by removing the unnecessary structure, and therefore, the vertical module thermal resistance characteristics can be calculated as being reduced by 23% compared to the module having the protrusion structure and by 27% compared to the module having the spacer-applied structure.

In addition, it is possible to shorten the distance between the chip and the power terminal by removing the unnecessary structure, thereby improving the electrical characteristics of the module such as the on-resistance and the inductance.

In addition, the present proposed technology can remove the unnecessary structure existing between the chip and the substrate, thereby removing the material price of the corresponding structure, and reduce the process cost for implementing the corresponding structure, thereby improving the cost competitiveness of the module.

BRIEF DESCRIPTION OF THE FIGURES

FIGS. 20, 21, 22, 23, and 24 sequentially show a process of manufacturing a double-sided cooling type power module according to a second exemplary embodiment of the present disclosure.

DETAILED DESCRIPTION

To fully understand the present disclosure, the operational advantages of the present disclosure, and the objects achieved by practicing the present disclosure, reference should be made to the accompanying drawings showing preferred exemplary embodiments of the present disclosure and the contents described in the accompanying drawings.

In describing the preferred exemplary embodiments of the present disclosure, a description of well-known technologies or repetitive descriptions that can unnecessarily obscure the gist of the present disclosure will be reduced or omitted.

Figure 9:
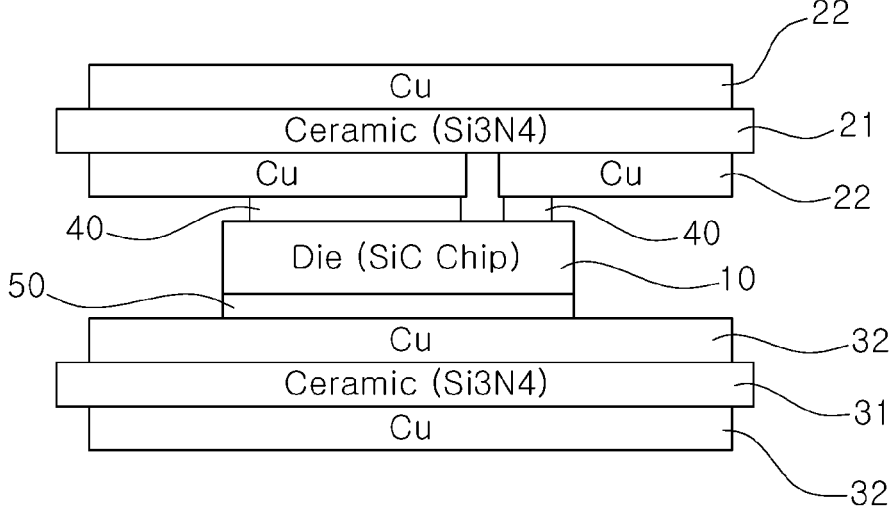
FIG. 9 shows a double-sided cooling type power module according to an exemplary embodiment of the present disclosure.

FIG. 9 shows a double-sided cooling type power module according to an exemplary embodiment of the present disclosure, and FIGS. 10 to 19 sequentially show a process of manufacturing a double-sided cooling type power module according to a first exemplary embodiment of the present disclosure.

Hereinafter, a double-sided cooling type power module according to an exemplary embodiment of the present disclosure and a method for manufacturing the double-sided cooling type power module according to a first exemplary embodiment will be described with reference to FIGS. 9 to 19.

To implement a double-sided cooling type power module, the present disclosure presents a thin module structure that removes a thick spacer or a protrusion structure disposed for the electrical and thermal connection between an upper portion of a chip and an upper substrate, and directly connects an upper electrode part of the chip and an electrode part of the upper substrate.

To remove the protrusion that performs a transfer function of a bonding material and directly bond the upper portion of the chip and the electrode part of the upper substrate in the conventional module structure, a method capable of directly transferring an Ag material for bonding the chip and the substrate to an upper surface of the chip or the electrode part of the upper substrate is disclosed. There are two methods presented as the transfer method, in which one is a method for removing the parts unnecessary for bonding of the bonding material existing in the Ag film using a block, and then transferring the remaining bonding material remaining in the film to the upper portion of the chip. The other is a method for transferring the bonding material to the upper substrate by applying heat and pressure to a protrusion block on the rear surface of the Ag film for bonding.

As described above, when the bonding material can be separately disposed on each of the gate and source electrode parts existing on the upper portion of the chip, the chip and the substrate can be directly bonded even when there is no protrusion.

When the substrate and the chip can be directly bonded without protrusion, a current and heat delivery path can be shortened, thereby improving the characteristics of the module and eliminating the occurrence of a problem caused by forming the protrusion in advance.

Figure 1:
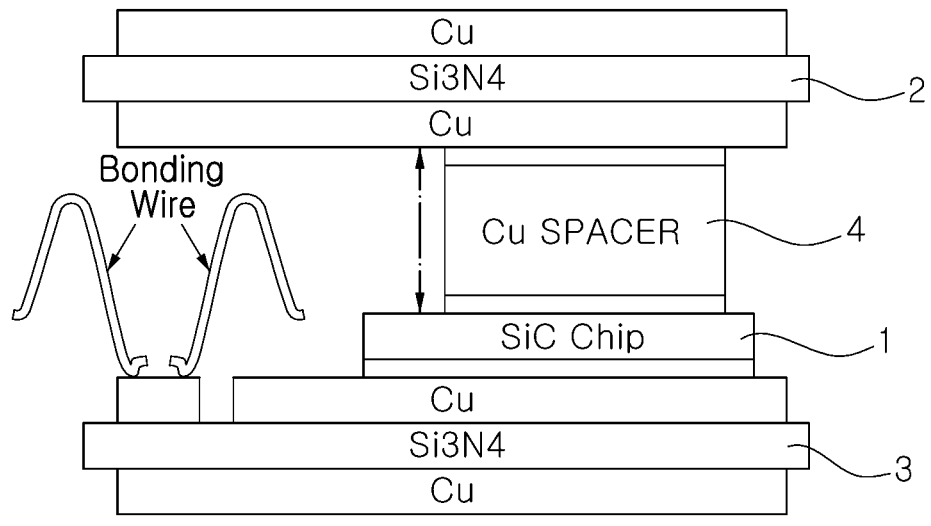
FIGS. 1 and 2 show an example of a conventional power module.
Figure 2:
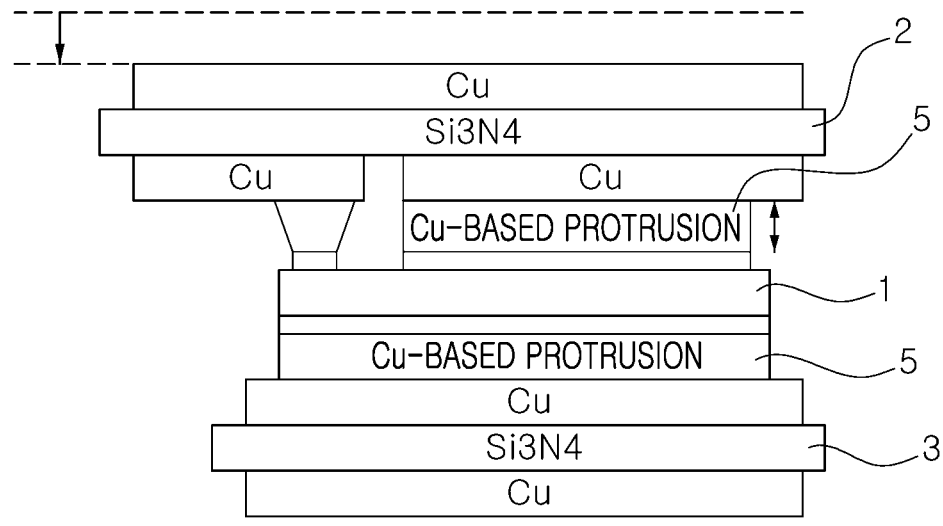
Figure 3:
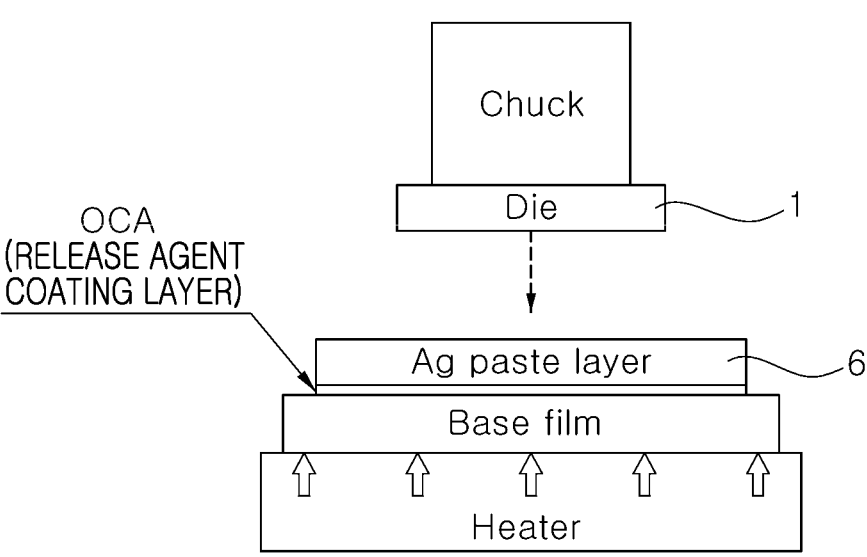
FIGS. 3, 4, 5, 6, 7, and 8 sequentially show a process of manufacturing the power module of FIG. 2.
Figure 4:
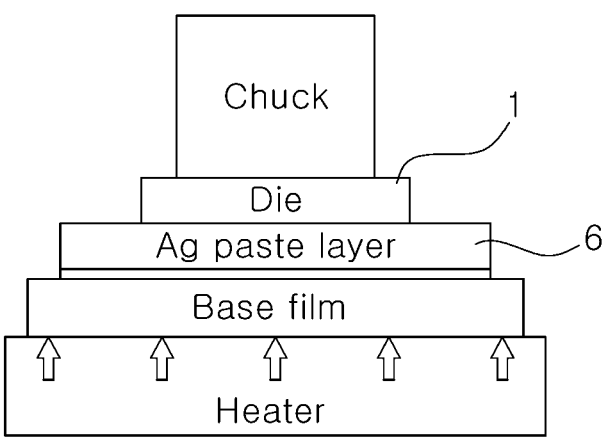
Figure 5:
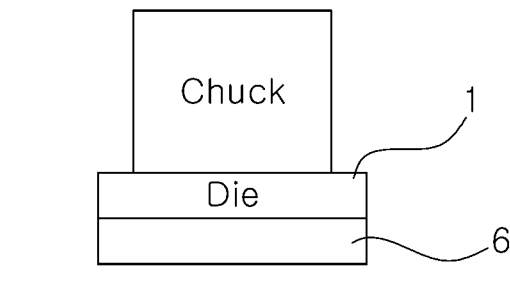
Figure 5:
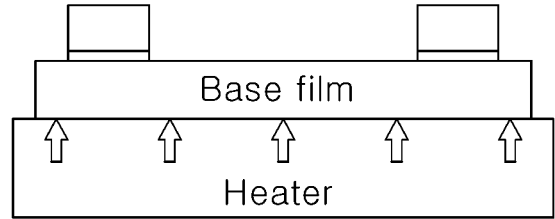
Figure 6:
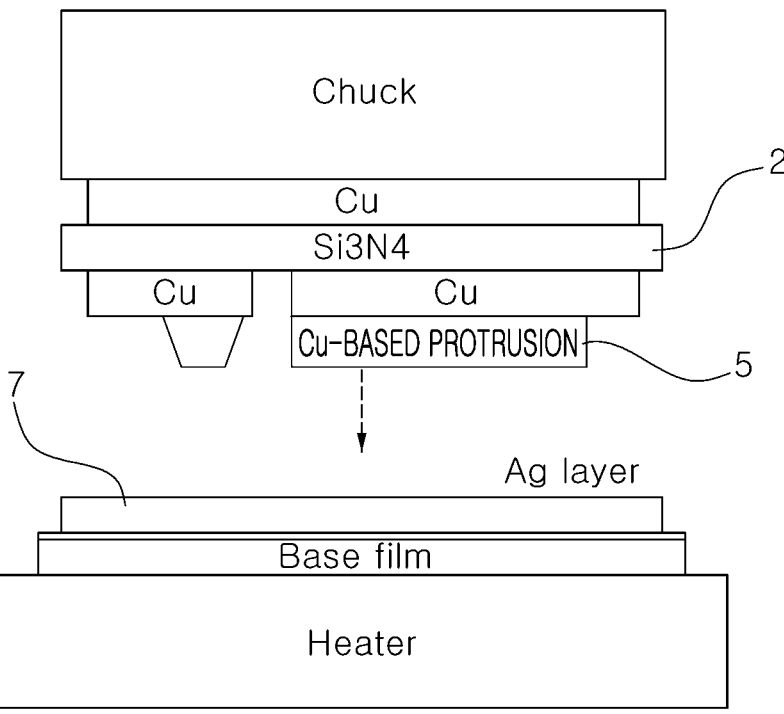
Figure 7:
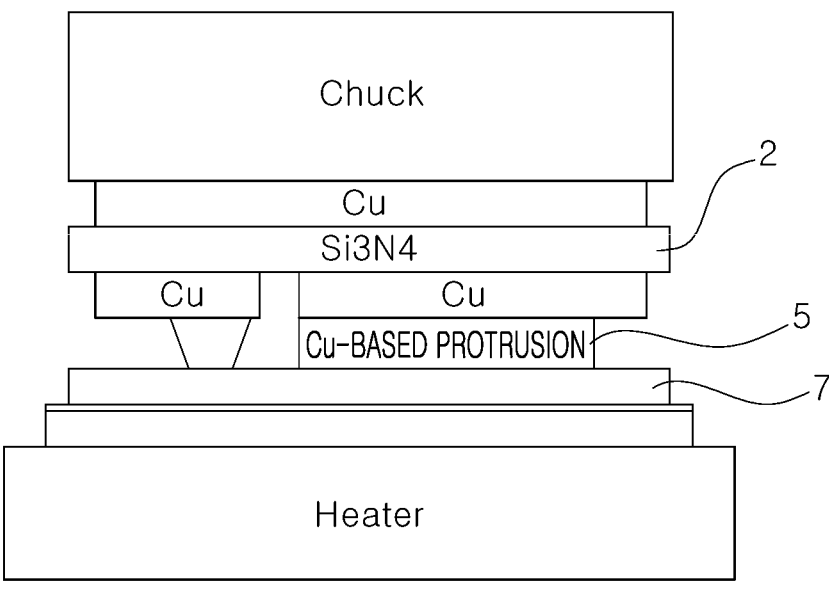
Figure 8:
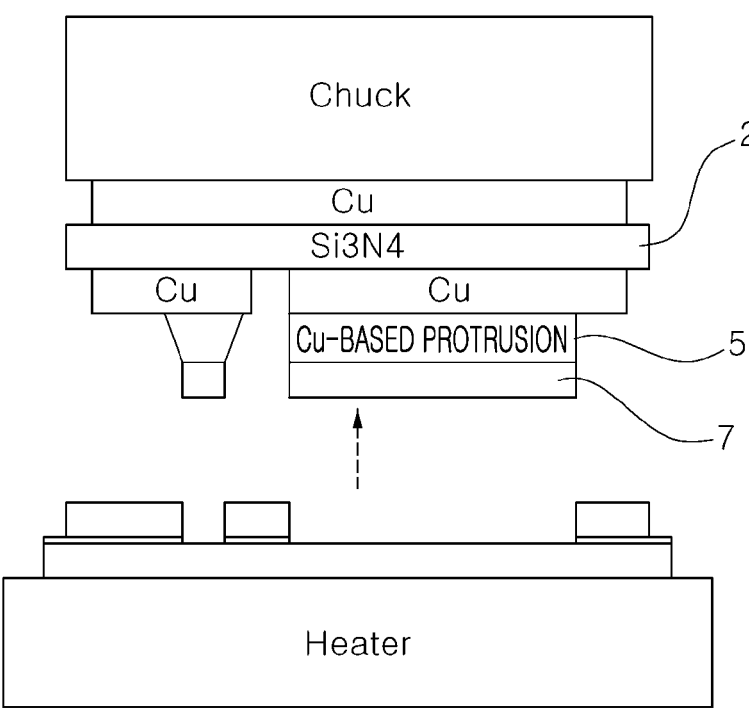

To this end, in the double-sided cooling type power module according to the exemplary embodiment of the present disclosure, as shown in FIG. 1, ceramic substrates 21, 31 are stacked above and below a semiconductor chip 10, respectively, and directly bonded to electrode layers 22, 32 formed on the ceramic substrates 21, 31 without spacer by bonding layers (Ag sintering layers) 40, 50.

A method for manufacturing the double-sided cooling type power module according to the first exemplary embodiment is a method for removing the parts unnecessary for bonding of the bonding material existing in the Ag film using the block, and then transferring the remaining bonding material remaining in the film to the upper portion of the chip.

Figure 10:
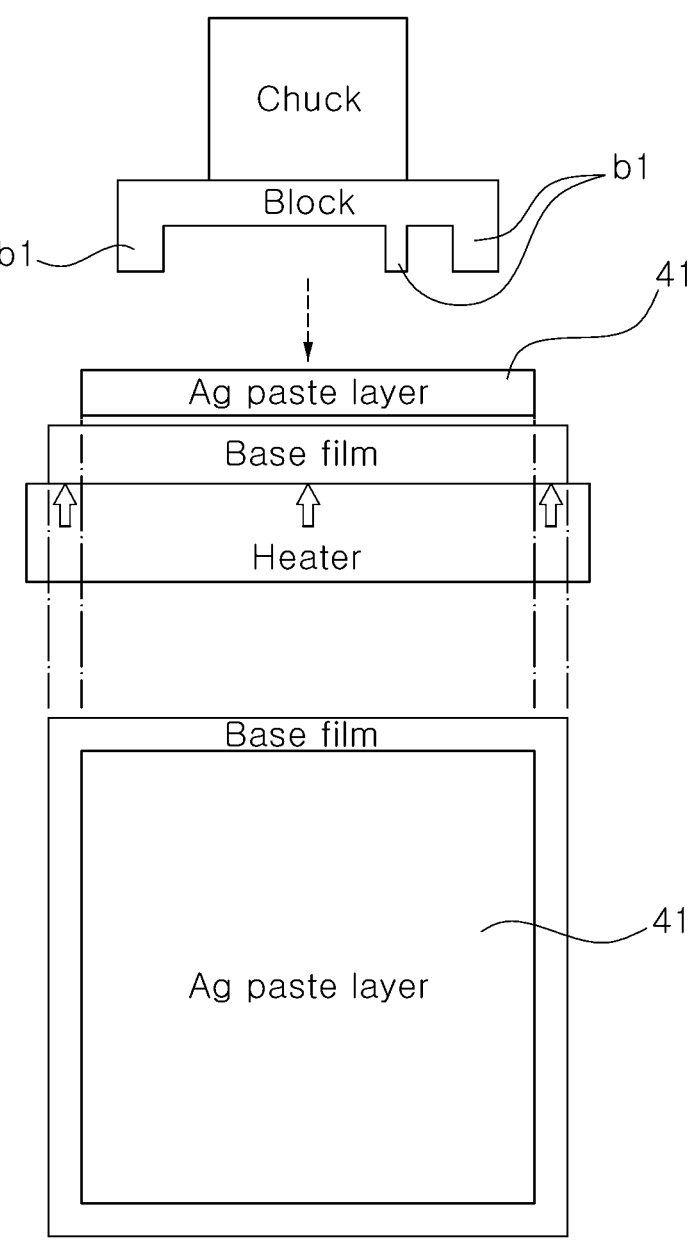
FIGS. 10, 11, 12, 13, 14, 15, 16, 17, 18, and 19 sequentially show a process of manufacturing a double-sided cooling type power module according to a first exemplary embodiment of the present disclosure.
Figure 11:
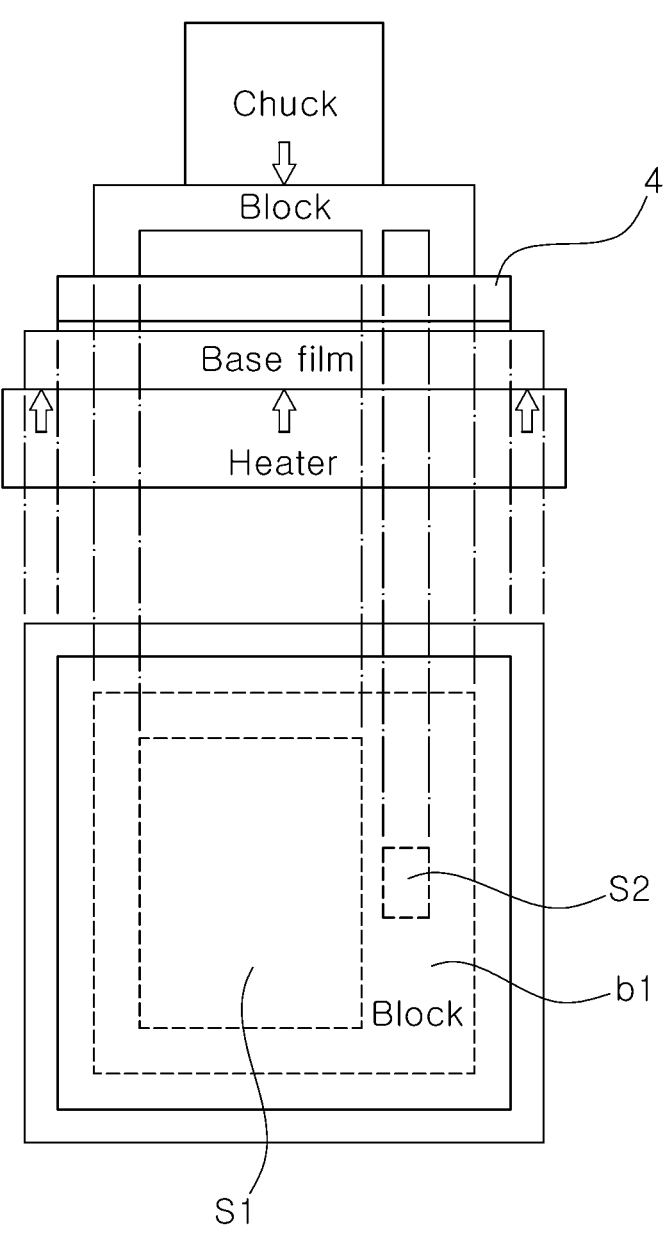

First, to form an upper bonding layer 40 as shown in FIG. 10, the block of a certain shape is disclosed above the bonding material 41 coated on a base film, and as shown in FIG. 11, the block moves downward to be in contact with the bonding material 41 and is pressurized and heated.

The block is a block patterned in the certain shape, and has a protrusion (b1) protruding from a flat plate as shown in FIG. 11, and the protrusion (b1) partitions into two regions, and the two regions (s1, s2) are separately formed to correspond to the gate electrode part and the source electrode part of the semiconductor chip 10.

Figure 12:
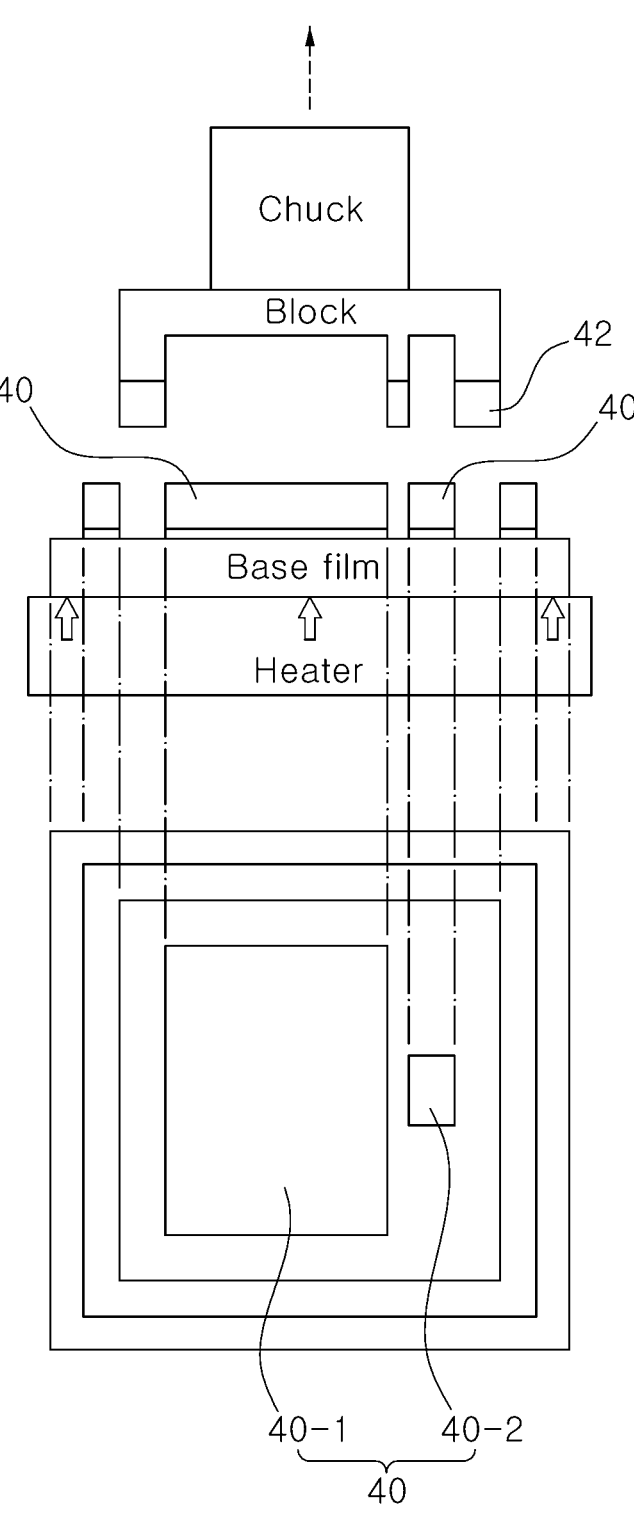

Therefore, as shown in FIG. 12, the bonding material 42 in the region corresponding to the protrusion (b1) of the block is transferred to the block, and upper bonding layers 40-1, 40-2 corresponding to the two regions (s1, s2) of the block and separated into two regions remain on the base film.

Figure 13:
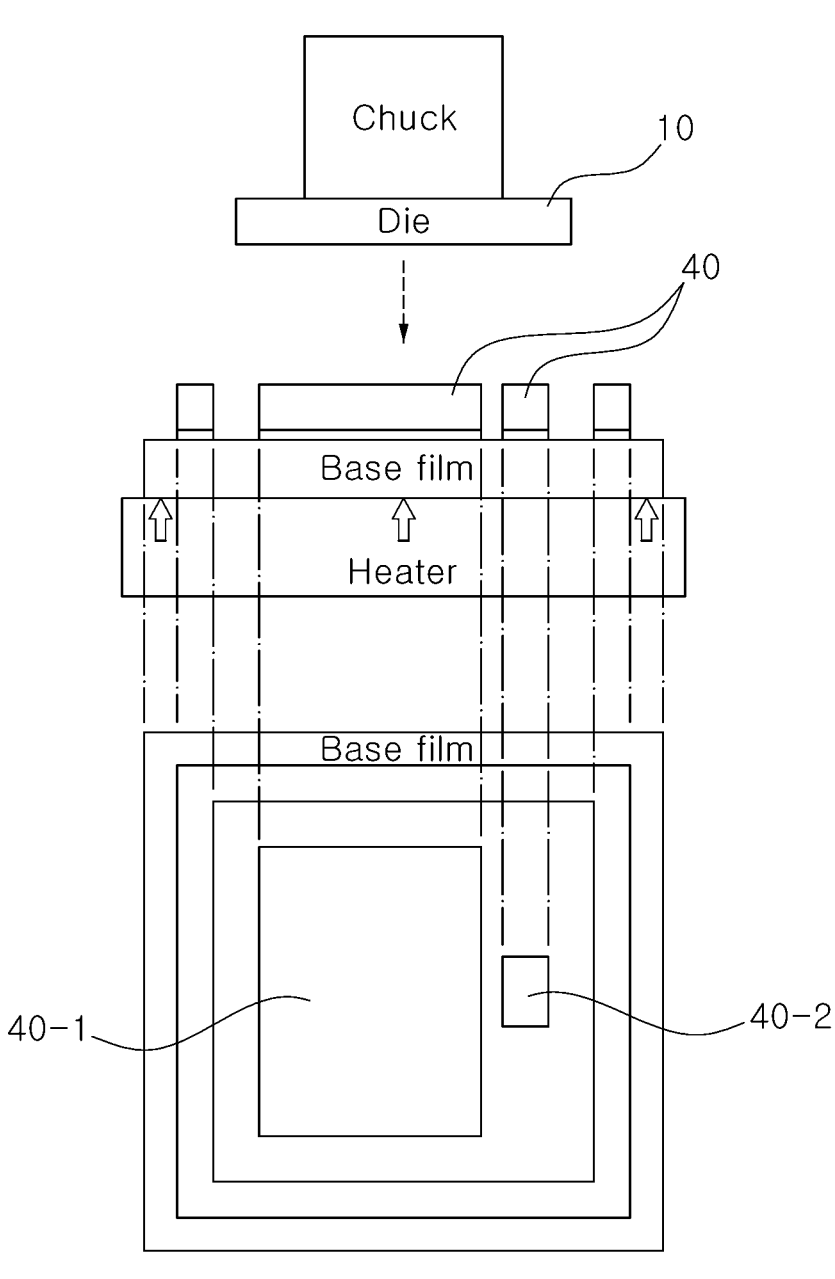
Figure 14:
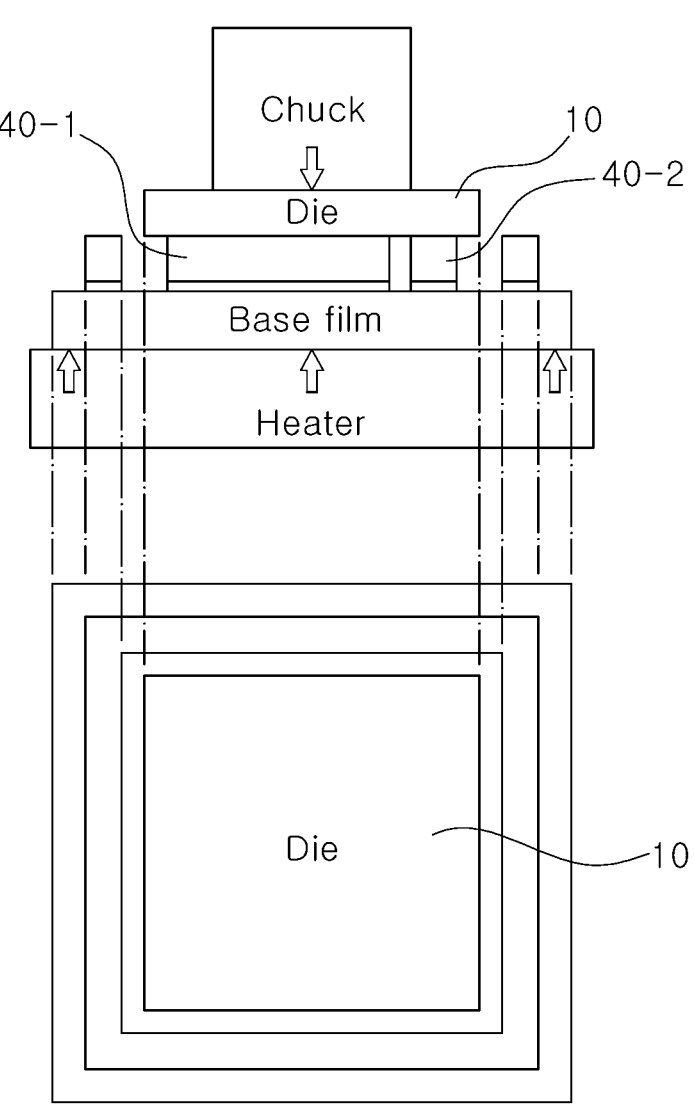

Next, as shown in FIG. 13, the semiconductor chip 10 is positioned by using the chuck above the patterned upper bonding layer 40, and as shown in FIG. 14, the semiconductor chip 10 moves downward to be in contact with the upper bonding layer 40 and is pressurized and heated.

Figure 15:
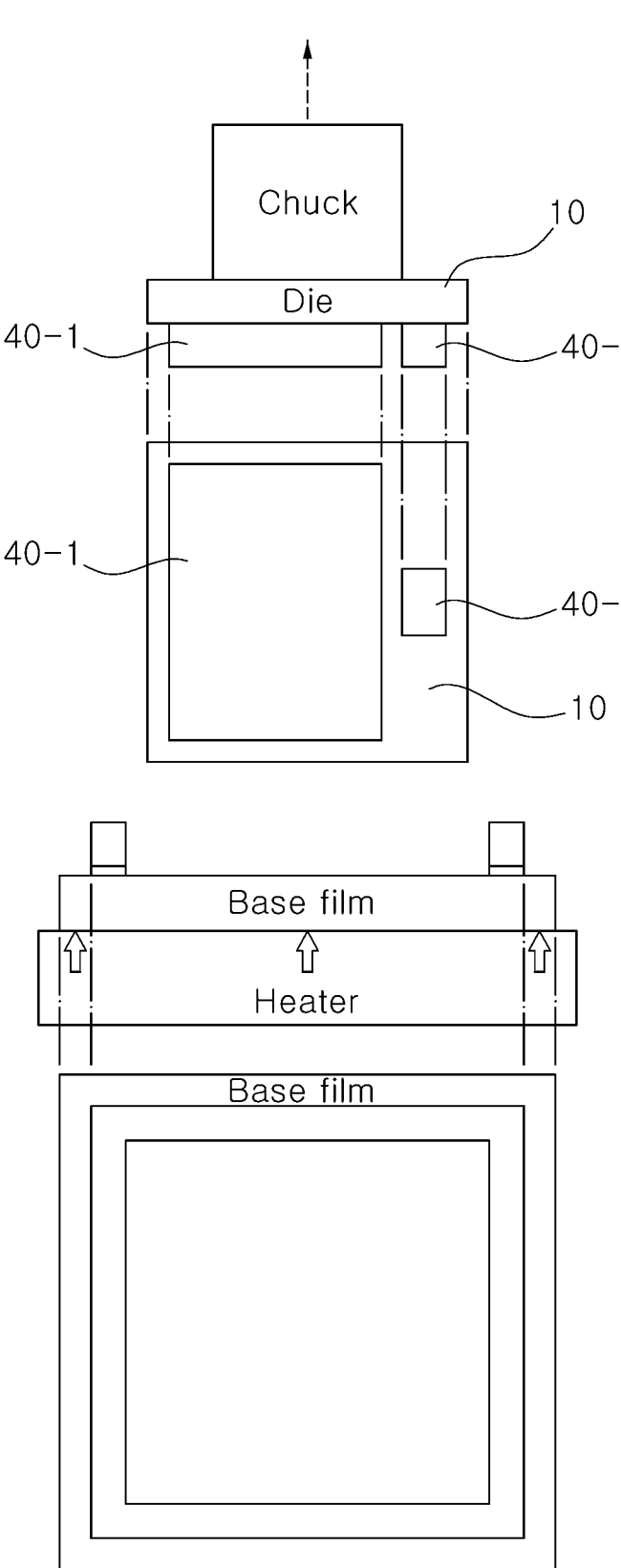

Next, the upper bonding layers 40-1, 40-2 are transferred to the semiconductor chip 10 as shown in FIG. 15.

Figure 16:
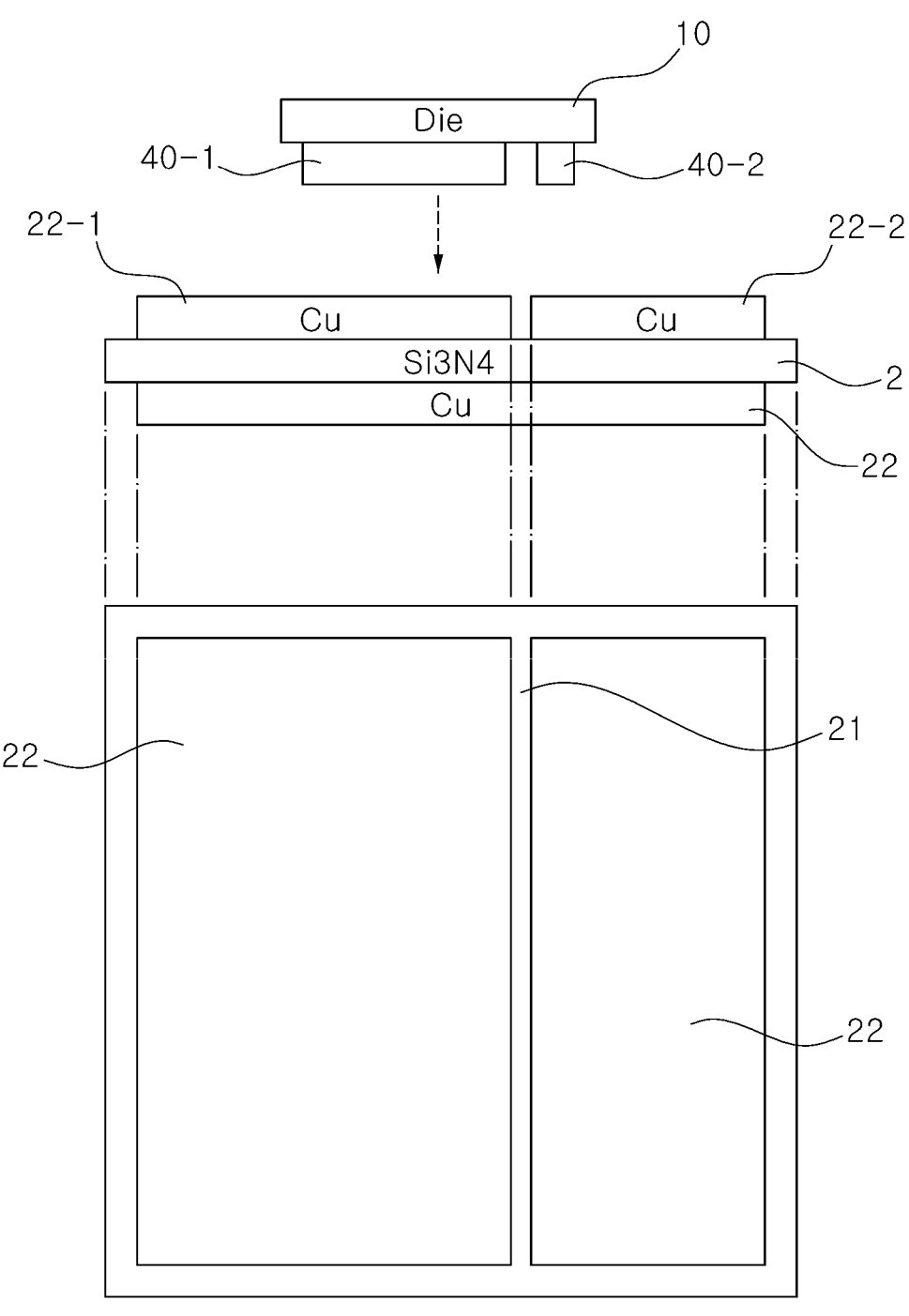

Next, as shown in FIG. 16, the semiconductor chip 10 is disposed on the upper substrate 21 having the upper electrode layers 22 formed on both surfaces thereof, and the upper bonding layers 40-1, 40-2 face the upper substrate 21 side.

Figure 17:
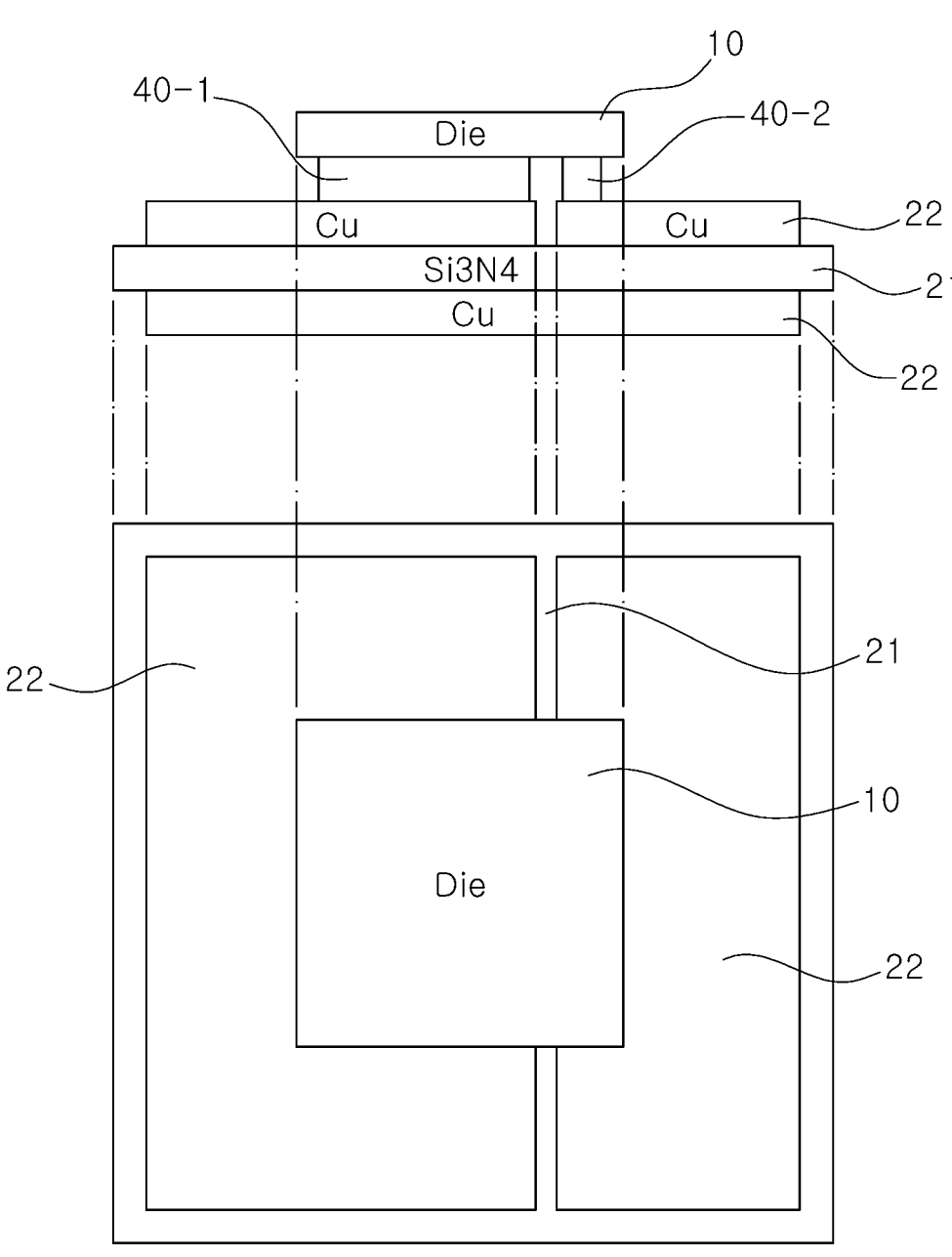

Here, the upper electrode layer 22 has a first region 22-1 and a second region 22-2 separately formed to be spaced apart from each other, and as shown in FIG. 17, the semiconductor chip 10 is disposed to move downward so that the two regions of the upper bonding layer 40 are in contact with the first region 22-1 and the second region 22-2, respectively.

Figure 18:
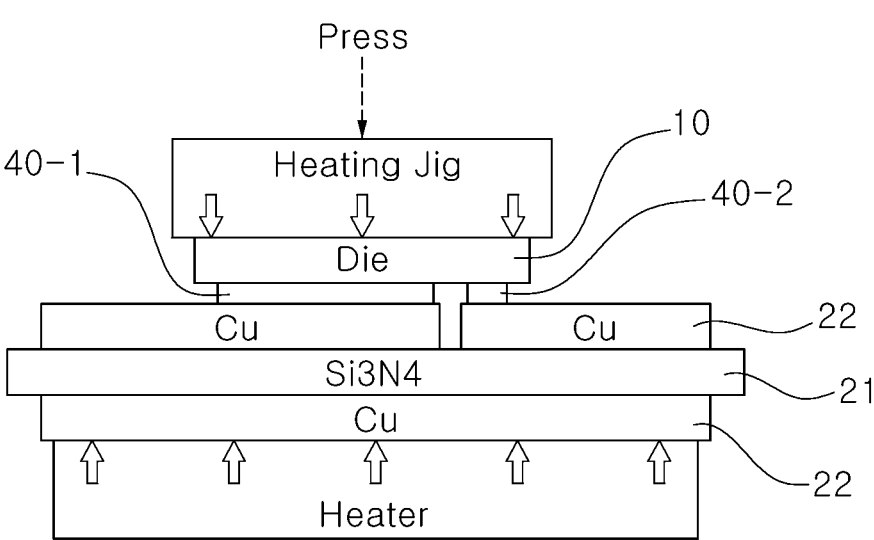
Figure 19:
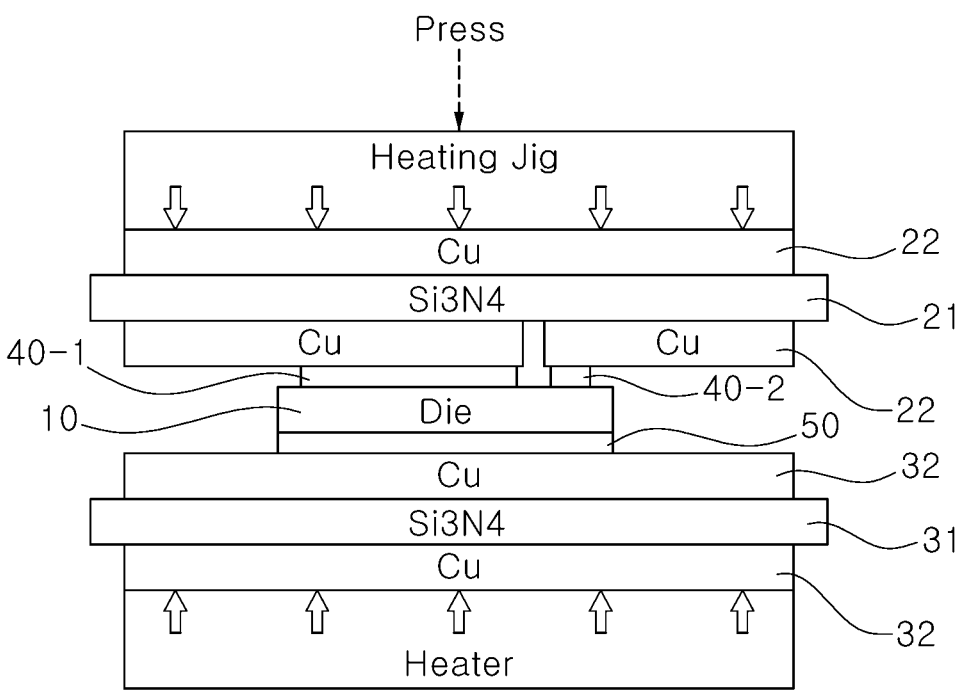

In addition, as shown in FIG. 18, the upper bonding layer 40 is sintered by pressurizing the upper portion of the semiconductor chip 10 using a heating jig.

Likewise, the power module shown in FIG. 9 is manufactured by positioning a lower surface of the semiconductor chip 10 on a lower electrode layer 32 formed on a lower substrate 31 with a lower bonding layer 50 interposed therebetween, and pressurizing a lower portion of the semiconductor chip 10 to sinter the lower bonding layer 50.

In implementing the double-sided cooling type module, as the structure of the module proposed by the present disclosure, proposed is the thin power module structure in which the upper portion of the chip is directly bonded to the substrate, thereby eliminating the reduction in the heat exchange performance due to the presence of the structure such as the spacer or the protrusion and having the cooling part and the chip close to each other.

This is a structure of the power module composed of two or more transistors capable of ON/OFF control, and is a double-sided cooling type power module in which insulating circuit substrates exist above and below the chip, respectively.

As a structure in which the gate electrode part and the source electrode part on the upper portion of the chip are directly bonded to the electrode part of the upper substrate, the bonding method can use a process such as Ag sintering or soldering, and the present disclosure proposes a pressurized Ag sintering bonding in which there is no spread of the bonding material and no high-temperature defect issue.

Next, FIGS. 20 to 24 sequentially show a process of manufacturing a double-sided cooling type power module according to a second exemplary embodiment of the present disclosure.

A method for manufacturing a double-sided cooling type power module according to a second exemplary embodiment is a method for transferring the bonding material to the upper substrate by applying heat and pressure to the protrusion block on the rear surface of the Ag film for bonding.

Figure 20:
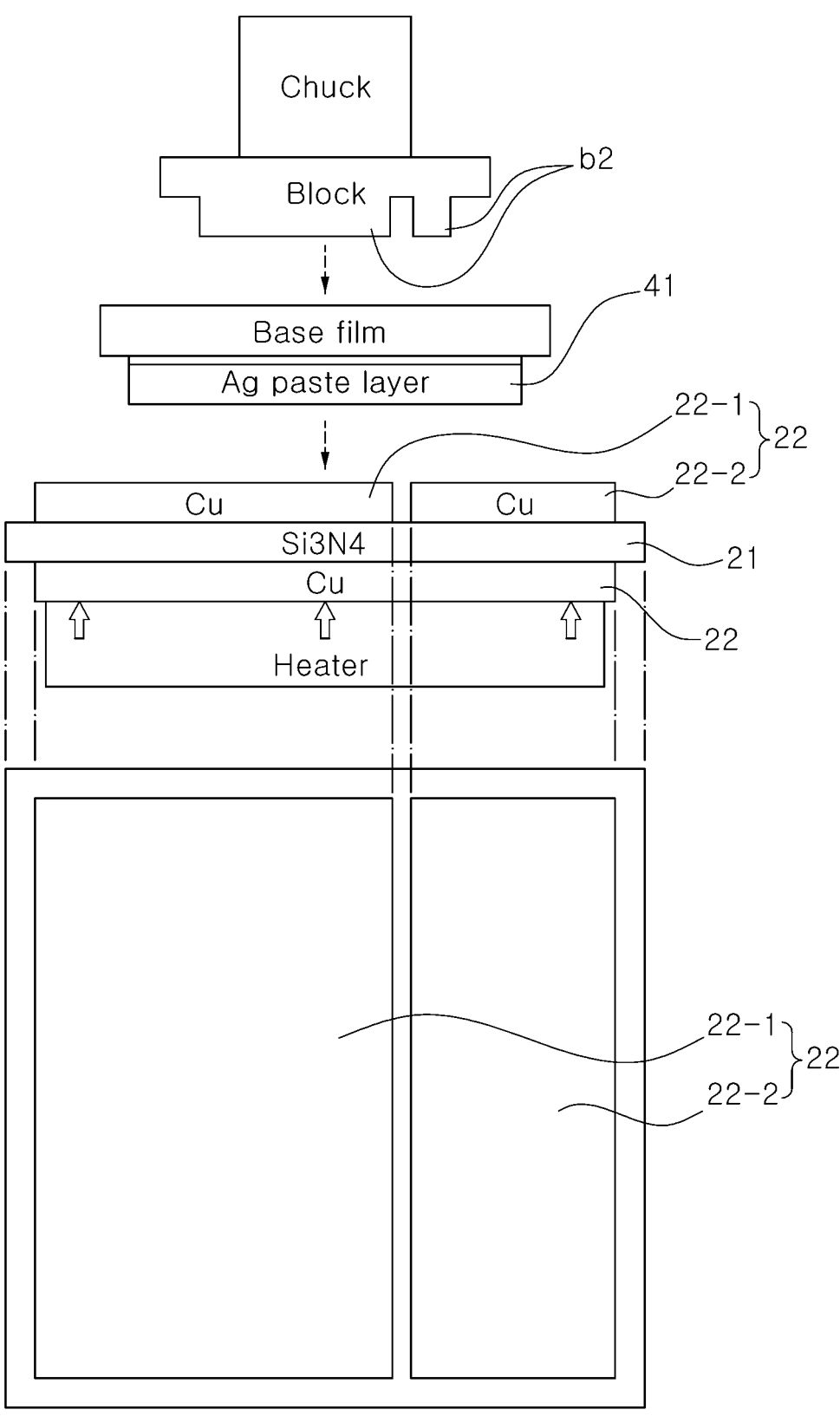
Figure 21:
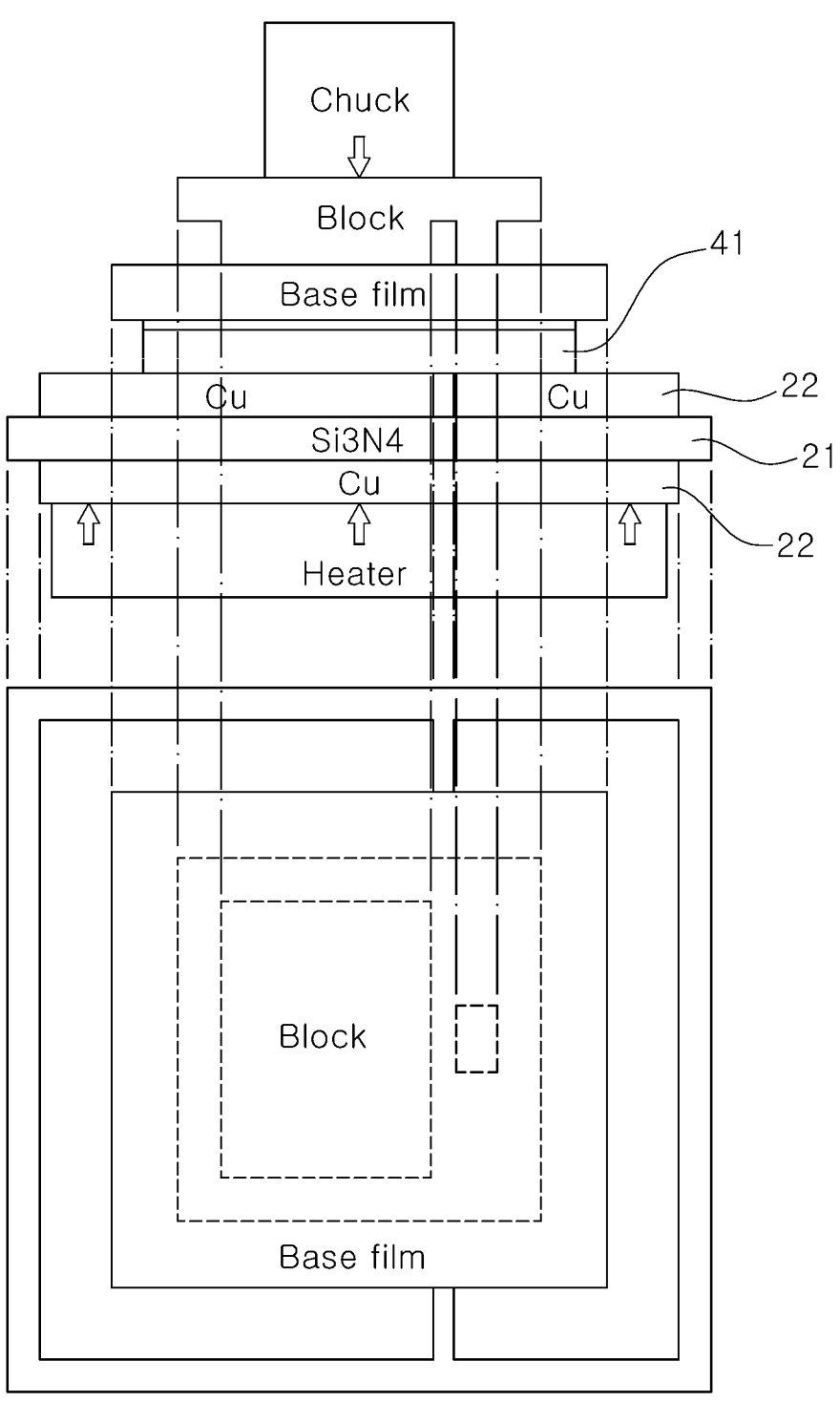

First, to form the upper bonding layer 40 as shown in FIG. 20, the bonding material 41 coated on the base film is disposed above the upper substrate 21 formed with the upper electrode layer 22 to face the upper substrate 21 side, a block of a certain shape is disposed above the base film, and as shown in FIG. 21, the block moves downward so that the block, the bonding material 41, and the upper substrate 21 are in contact with one another, and therefore, the block is pressurized and heated.

The block is a block patterned in the certain shape, and has the protrusion (b2) of two regions protruding from the flat plate and spaced apart from each other as shown in FIG. 21, and the two regions are separately formed to correspond to the gate electrode part and the source electrode part of the semiconductor chip 10.

Here, the upper electrode layer 22 also has the first region 22-1 and the second region 22-2 separately formed to be spaced apart from each other, and the two regions of the block correspond to the first region 22-1 and the second region 22-2, respectively.

Figure 22:
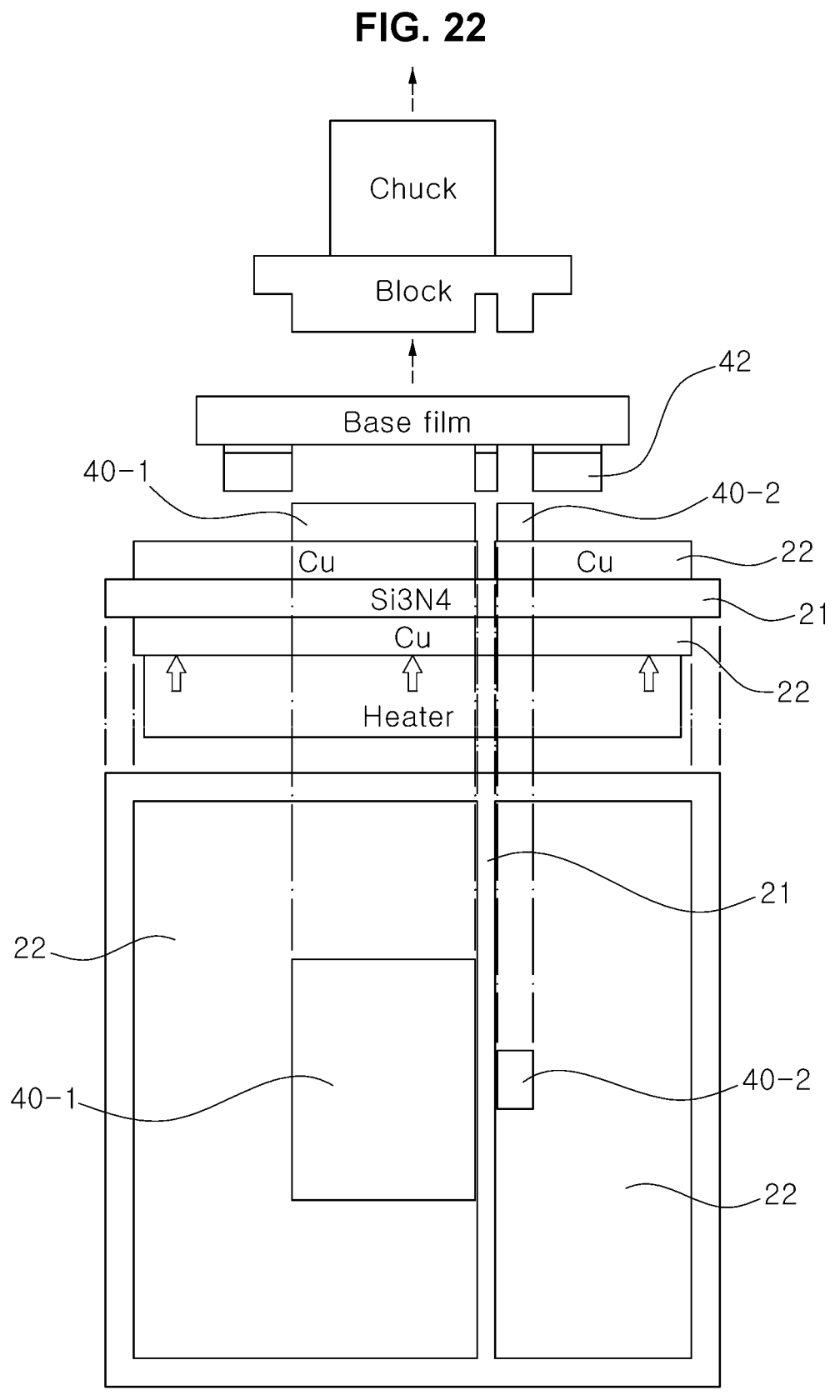

Therefore, as shown in FIG. 22, the region corresponding to the protrusion of the block is transferred to the upper electrode layer 22 to form the upper bonding layers 40-1, 40-2, and the bonding material 42 not transferred remains on the base film.

Figure 23:
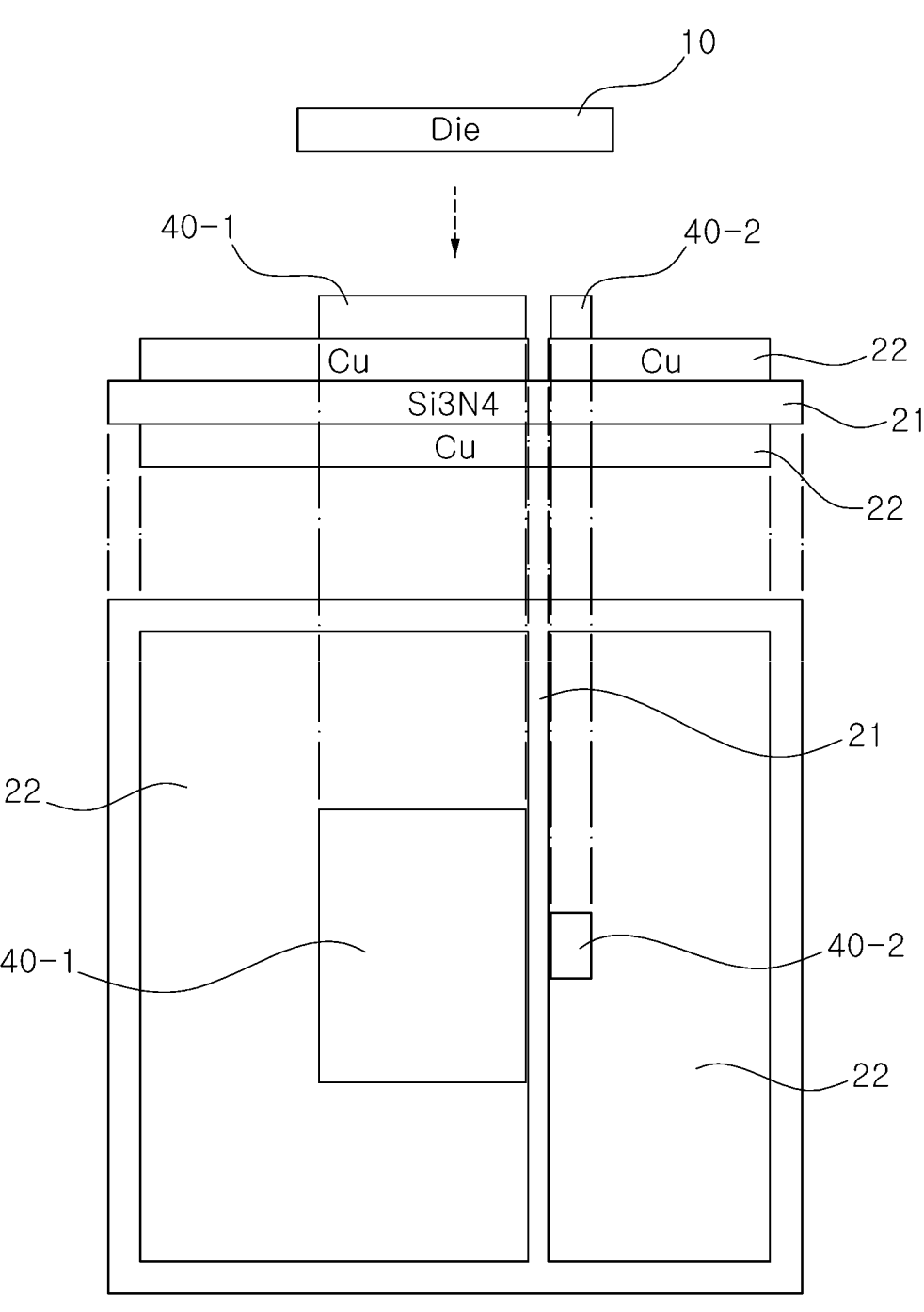
Figure 24:
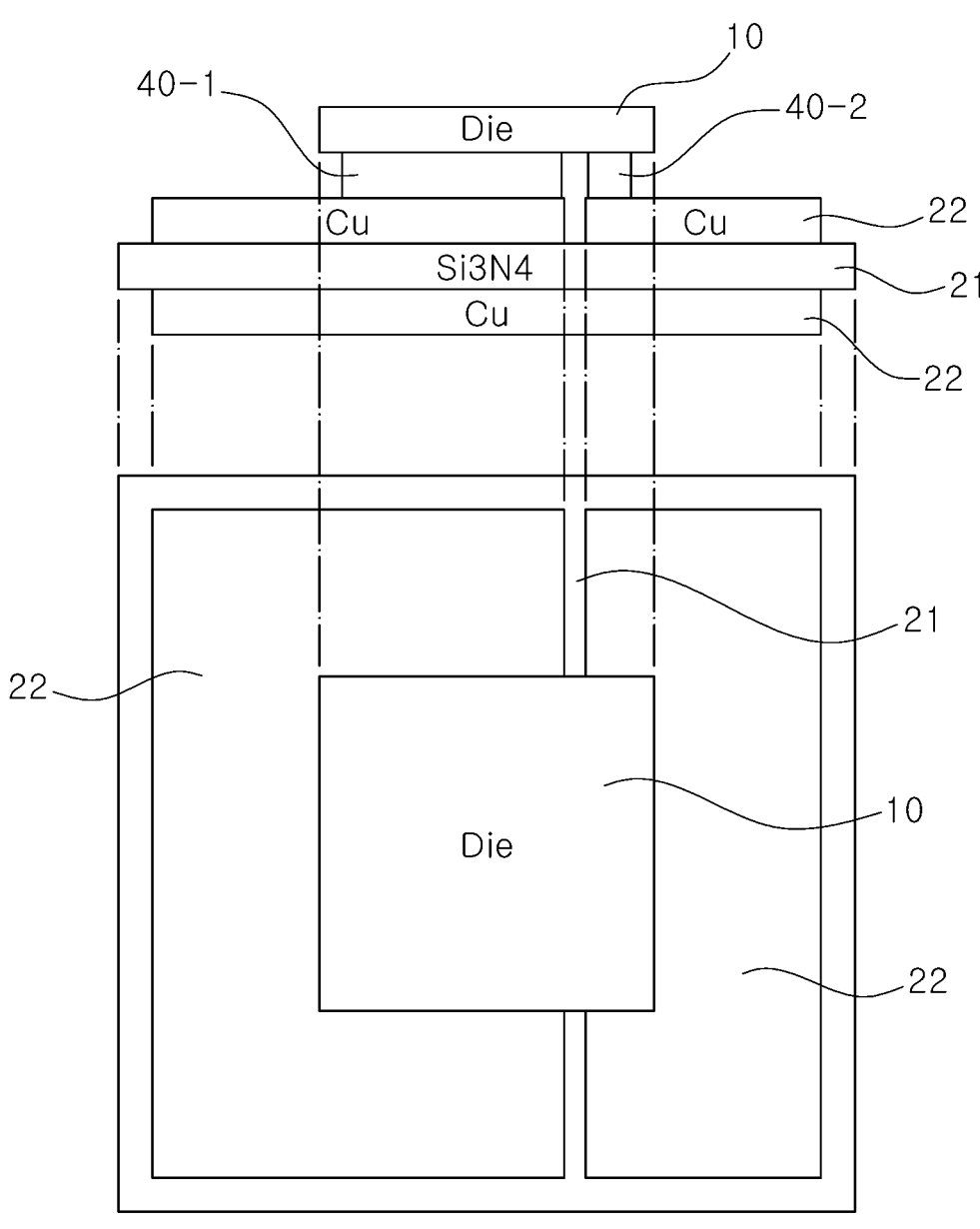

Next, as shown in FIG. 23, the semiconductor chip 10 is disposed by using the chuck above the upper bonding layer 40 separately patterned into two regions, and as shown in FIG. 24, the semiconductor chip 10 moves downward to be in contact with the upper bonding layers 40-1, 40-2 and is pressurized and heated.

Then, as in FIGS. 16 and 17, the power module shown in FIG. 9 is manufactured by sequentially pressurizing the upper substrate 21 and the lower substrate 31 to sinter the upper bonding layers 40-1, 40-2 and the lower bonding layer 50.

Figure 25:
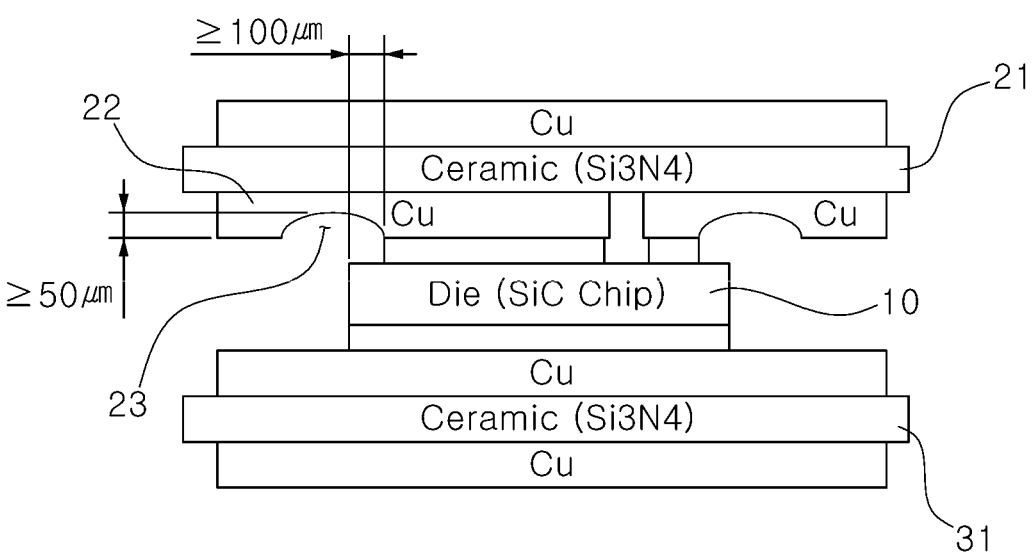
FIG. 25 shows a double-sided cooling type power module according to an application exemplary embodiment of the present disclosure.

Next, FIG. 25 shows a double-sided cooling type power module according to an application exemplary embodiment of the present disclosure, and only the parts different from the aforementioned exemplary embodiment will be described.

When the upper portion of the chip and the upper electrode layer 22 formed on the upper substrate 21 are bonded, a thin bonding part is formed between the chip 10 and the substrate 21 and therefore, there can occur an insulation problem such as causing a short circuit between the edge of the chip 10 and the electrode layer 22 of the upper substrate 21. To prevent such a problem, according to the application exemplary embodiment, a groove structure having a step is disposed around the electrode layer 22 of the upper substrate 21 bonded to the chip 10, thereby securing a distance at which the insulation can be possible between the electrode layer 22 of the upper substrate and the edge of the chip 10.

In other words, a groove 23 is formed in the upper electrode layer 22 adjacent to the upper bonding layer 40, and the groove 23 can have a square or circular cross section.

For a general epoxy molding compound (EMC) material, the characteristic of a dielectric breakdown strength is a value of about 40 V/$\mu$m, and therefore, the insulation of about 1000 V is possible based on the thickness of the pressurized sintered bonding part of 25 $\mu$m, which is not suitable for a withstand voltage of 1200 V or more.

Therefore, it is necessary to widen the gap so that the thickness of the sintered bonding part or more can be maintained between the electrodes, and to secure the gap so that the insulation of 2000 V or more can be secured assuming the EMC filling between the edge of the chip 10 and the electrode layer 22 of the upper substrate 21. To this end, according to this proposal, it is possible to secure the insulation characteristic by disposing the groove structure having the step around the electrode part of the upper substrate bonded to the chip, and the depth of the groove 23 can vary depending upon the difference in the characteristics of the insulating material such as EMC, but it is preferable to have the depth of 50 $\mu$m or more at which the insulation of 2000 V or more can be secured, and a dent is formed at a position of 100 $\mu$m or more at which the insulation of the edge of the chip 10 can be maintained even on the upper surface of the chip 10.

In other words, the length from the edge of the groove 23 to the edge of the upper bonding layer 40 to the edge of the semiconductor chip 10 is preferably 100 $\mu$m or more.

Meanwhile, the upper substrate 21 and the lower substrate 31 can be electrically connected to constitute the electrical circuit of the module, and this connection can be implemented by disposing the structure such as a chip element or a spacer. For the bonding for this, a process such as Ag sintering or soldering can be used.

In addition, a power terminal can be connected to the upper or lower substrate by sintering bonding, soldering, or welding, and a signal pin terminal can be bonded to the substrate or connected between a signal terminal and the substrate by wire bonding, etc.

As described above, the present disclosure has been described with reference to the illustrative drawings, but is not limited to the described exemplary embodiment, and it is apparent to those skilled in the art that various modifications and changes can be made without departing from the spirit and scope of the present disclosure. Therefore, these modifications or changes should be said to belong to the claims of the present disclosure, and the scope of the present disclosure should be interpreted based on the appended claims.

The invention claimed is:

1. A double-sided cooling type power module comprising:
a semiconductor chip having a first end and a second end;
an upper substrate bonded to an upper surface of the semiconductor chip; and
a lower substrate bonded to a lower surface of the semiconductor chip;
wherein the semiconductor chip is bonded to an upper electrode formed on the upper substrate and extending laterally from each of the first end and the second end of the semiconductor chip;
wherein the semiconductor chip is directly bonded to a lower electrode formed on the lower substrate;
wherein a bonding material is interposed between an upper surface of the semiconductor chip and the upper electrode;
a first groove formed in a surface of the upper electrode that is not bonded to the bonding material and being adjacent to the bonding material, the first groove extending in an upward direction of the first end of the semiconductor chip;
a second groove formed in a surface of the upper electrode that is not bonded to the bonding material and being adjacent to the bonding material, the second groove extending in an upward direction of the second end of the semiconductor chip; and
wherein the first and second grooves each include a portion that overlaps the semiconductor chip and a portion that does not overlap the semiconductor chip.

2. The double-sided cooling type power module of claim 1, wherein the bonding material is separately patterned into two regions.

3. The double-sided cooling type power module of claim 2, wherein the upper electrode layer has a first region and a second region separately formed to be spaced apart from each other, and the two regions of the bonding material are in contact with the first region of the upper electrode layer and the second region of the upper electrode layer.

4. The double-sided cooling type power module of claim 3, wherein the separated two regions of the bonding material are separately formed to correspond to a gate electrode part and a source electrode part of the semiconductor chip.

5. The double-sided cooling type power module of claim 1, wherein the depth of the groove is 50 μm or more, and a linear distance in a surface direction from the edge of the groove to the edge of the semiconductor chip is 100 μm or more.

* * * * *